US010184955B2

(12) United States Patent
Meng

(10) Patent No.: US 10,184,955 B2
(45) Date of Patent: Jan. 22, 2019

(54) PROBE SUPPORTING AND ALIGNING APPARATUS

(71) Applicant: Lenovo Enterprise Solutions (Singapore) Pte. Ltd., Singapore (SG)

(72) Inventor: Jian Meng, Kanata (CA)

(73) Assignee: LENOVO ENTERPRISE SOLUTIONS (SINGAPORE) PTE. LTD., Singapore (SG)

(*) Notice: Subject to any disclaimer, the term of this patent is extended or adjusted under 35 U.S.C. 154(b) by 399 days.

(21) Appl. No.: 14/875,461

(22) Filed: Oct. 5, 2015

(65) Prior Publication Data

US 2016/0025774 A1    Jan. 28, 2016

Related U.S. Application Data

(63) Continuation of application No. 13/476,332, filed on May 21, 2012, now Pat. No. 9,182,425.

(51) Int. Cl.
*G01R 1/04* (2006.01)
*G01R 1/067* (2006.01)
*G01R 31/28* (2006.01)
*G01R 1/073* (2006.01)

(52) U.S. Cl.
CPC ............ *G01R 1/04* (2013.01); *G01R 1/06705* (2013.01); *G01R 31/2886* (2013.01); *G01R 1/07371* (2013.01)

(58) Field of Classification Search
CPC .. G01R 1/04; G01R 31/2886; G01R 1/06705; G01R 1/07371
USPC .......................... 324/755.02, 756.01, 756.03
See application file for complete search history.

(56) References Cited

U.S. PATENT DOCUMENTS

| 4,812,745 A | 3/1989 | Kern |
| 5,166,602 A * | 11/1992 | Byford ............... G01R 1/07307 324/755.08 |
| 5,323,105 A | 6/1994 | Davis, Jr. et al. |
| 5,381,417 A | 1/1995 | Loopik et al. |
| 5,387,872 A | 2/1995 | Nightingale |
| 5,446,624 A | 8/1995 | Saito |

(Continued)

FOREIGN PATENT DOCUMENTS

JP    2011069615 A    4/2011

OTHER PUBLICATIONS

Anonymous, "Improved Oscilloscope Probe Holder," IP.com Prior Art Database, Technical Disclosure, Electronic publication Apr. 28, 2008, pp. 1-4.

(Continued)

*Primary Examiner* — Farhana Hoque
(74) *Attorney, Agent, or Firm* — Zilka-Kotab, P.C.

(57) ABSTRACT

An apparatus for testing electrical characteristics of a device, having one or more testing sites. The apparatus comprises a nonconductive plate having a through-hole. The through-hole is positioned such that it at least partially overlays one of the one or more testing sites when at least a portion of the bottom surface of the nonconductive plate is adjacent to the device to be tested. The apparatus also comprises a probe positioning body protruding from the top surface of the nonconductive plate and having a through-hole. The probe positioning body is positioned such that the through-hole of the probe positioning body at least partially aligns with the through-hole of the nonconductive plate.

20 Claims, 4 Drawing Sheets

(56) References Cited

U.S. PATENT DOCUMENTS

| | | | |
|---|---|---|---|
| 5,818,248 | A | 10/1998 | St. Onge |
| 6,043,671 | A | 3/2000 | Mizuta |
| 6,054,869 | A | 4/2000 | Hutton et al. |
| 6,292,003 | B1 | 9/2001 | Fredrickson et al. |
| 6,292,004 | B1 | 9/2001 | Kocher |
| 6,429,671 | B1 | 8/2002 | Duckworth et al. |
| 6,459,287 | B1 * | 10/2002 | Nightingale ....... G01R 1/06705 324/72.5 |
| 6,597,163 | B2 | 7/2003 | Fioravanti |
| 6,876,214 | B2 | 4/2005 | Crook et al. |
| 6,937,039 | B2 | 8/2005 | Barr et al. |
| 7,126,362 | B2 | 10/2006 | Yoshida et al. |
| 7,279,911 | B2 | 10/2007 | Tunaboylu et al. |
| 7,417,447 | B2 | 8/2008 | Kister |
| 7,424,775 | B2 | 9/2008 | Miczek et al. |
| 7,592,796 | B2 * | 9/2009 | Staggert ............. G01R 1/07371 324/756.07 |
| 8,387,572 | B2 | 3/2013 | Ulrey et al. |
| 9,182,425 | B2 | 11/2015 | Meng |
| 2002/0155735 | A1 | 10/2002 | Zhou et al. |
| 2004/0012383 | A1 | 1/2004 | Kimura |
| 2004/0012402 | A1 | 1/2004 | Sinclair |
| 2004/0051546 | A1 | 3/2004 | Thiessen |
| 2004/0194562 | A1 * | 10/2004 | Brockman ......... G01N 35/1004 73/864.24 |
| 2005/0152663 | A1 * | 7/2005 | Bench ................ G02B 6/4201 385/147 |
| 2006/0267602 | A1 | 11/2006 | Yang et al. |
| 2007/0164761 | A1 | 7/2007 | Annichiarico et al. |
| 2008/0261830 | A1 * | 10/2008 | Shibahara ........... B01L 3/50857 506/13 |
| 2010/0099277 | A1 | 4/2010 | Osato et al. |
| 2010/0176831 | A1 | 7/2010 | Palcisko et al. |
| 2010/0231249 | A1 | 9/2010 | Dang et al. |
| 2011/0006799 | A1 | 1/2011 | Mochizuki et al. |
| 2013/0257467 | A1 | 10/2013 | Tomioka |
| 2013/0307574 | A1 | 11/2013 | Meng |

OTHER PUBLICATIONS

Bocinski et al., "Probe Guidance Template and Probe," IP.com Prior Art Database, Technical Disclosure, Original publication Apr. 1, 1977; Electronic publication Mar. 3, 2005, pp. 1-2.

Bullard et al., "Miniature Multiprobe Assembly," IP.com Prior Art Database, Technical Disclosure, Original publication Oct. 1, 1970; Electronic publication Feb. 22, 2005, pp. 1-3.

Everett Charles Technologies, "Pure Zoom Fixtures for ATE," retrieved from http://www.home.agilent.com/upload/cmc_upload/All/ECT-PureZoomFixtures-ATE.pdf?&cc=US&lc=eng, Everett Charles Technologies Presentation, Board Test User Group Meeting, May 2011, pp. 1-18.

Kropa et al., "Soft-Touch Probe Chuck," IP.com Prior Art Database, Technical Disclosure, Original publication Dec. 1, 1985; Electronic publication Feb. 19, 2005, pp. 1-3.

Zobniw, L. M., "Orthogonal Shorts Detector," IP.com Prior Art Database, Technical Disclosure, Original publication Dec. 1, 1979; Electronic publication Feb. 20, 2005, pp. 1-3.

Non-Final Office Action from U.S. Appl. No. 13/476,332, dated Mar. 24, 2014.

Non-Final Office Action from U.S. Appl. No. 13/476,332, dated Nov. 6, 2014.

Final Office Action from U.S. Appl. No. 13/476,332, dated Jul. 24, 2014.

Final Office Action from U.S. Appl. No. 13/476,332, dated Apr. 23, 2015.

Notice of Allowance from U.S. Appl. No. 13/476,332, dated Jul. 15, 2015.

Meng, J., U.S. Appl. No. 13/476,332, filed May 21, 2012.

* cited by examiner

PROBE SUPPORTING AND ALIGNING APPARATUS

TECHNICAL FIELD

The present invention relates generally to hardware design and testing, and more specifically to electrical characteristic testing of electronic devices, such as printed circuit boards.

BACKGROUND

Electronic devices, such as computers, include a printed circuit board that contains the device's circuitry and components. The printed circuit board typically includes many electrical circuits and at least one component such as a processor, power supply or memory chip mounted to it. When electronic devices malfunction or when the design or manufacture of the device is not complete, a technician typically tests the device by probing the nodes of the device's printed circuit board with a probe coupled to a measuring device, such as an oscilloscope. A technician may also perform design verification by probing the nodes of the device's printed circuit board to measure the voltage or current on each node.

To probe a device's printed circuit board to measure signals, a technician typically contacts an active probe (i.e., a probe having circuitry within the probe body) or a passive probe to a pad or other accessible contact of the signal node. In addition, the technician may contact a second probe to another signal node or a ground of the printed circuit board. To accurately measure signals, the probes must typically remain in contact with the signal nodes. Probing an electronic device typically requires the technician to use one of his/her hands to support the probe and keep the probe still. In addition, testing an electronic device frequently requires a technician to operate the controls of the measuring device (oscilloscope), while probing the circuit and/or component.

SUMMARY

Embodiments of the present invention disclose a probe supporting apparatus for testing electrical characteristics of a device having one or more testing sites. The probe supporting apparatus comprises a nonconductive plate having a top surface, a bottom surface, and a through-hole. The through-hole is positioned such that the through-hole at least partially overlays one of the one or more testing sites when at least a portion of the bottom surface of the nonconductive plate is adjacent to the device to be tested. The probe supporting apparatus also comprises a probe positioning body protruding from the top surface of the nonconductive plate and having a through-hole. The probe positioning body is positioned such that the through-hole of the probe positioning body at least partially aligns with the through-hole of the nonconductive plate.

DETAILED DESCRIPTION

Detailed embodiments of the present invention are disclosed herein with reference to the accompanying drawings. It is to be understood that the disclosed embodiments are merely illustrative of potential embodiments of the present invention and may take various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In brief summary, one embodiment of the present invention is used in the context of hardware design and testing. A probe supporting apparatus may be designed to receive a probe so as to align the probe tip, protruding from the probe body, with a testing site on a device to be tested when the probe supporting apparatus is adjacent to the device to be tested. The probe supporting apparatus may allow the probe tip to stay in contact with the testing site during the test. The probe supporting apparatus may be fabricated from nonconductive material so as to reduce Radio Frequency Interference (RFI) during testing of a device to be tested and to prevent a testing site from electrically connecting to another testing site.

The probe supporting apparatus may be customized to receive any type of probe and to align one or more probes with specific testing sites of a device to be tested. The probe supporting apparatus may be designed to fit the entire device to be tested or just a portion of the device. Devices to be tested can be a printed circuit board (PCB), a ball grid array (BGA) device, such as a microprocessor, or any type of electronic device with testing sites. Testing sites may include, for example, signal pads, ground contacts, or BGA contacts.

The present invention will now be described in detail with reference to the figures.

Figure 1:
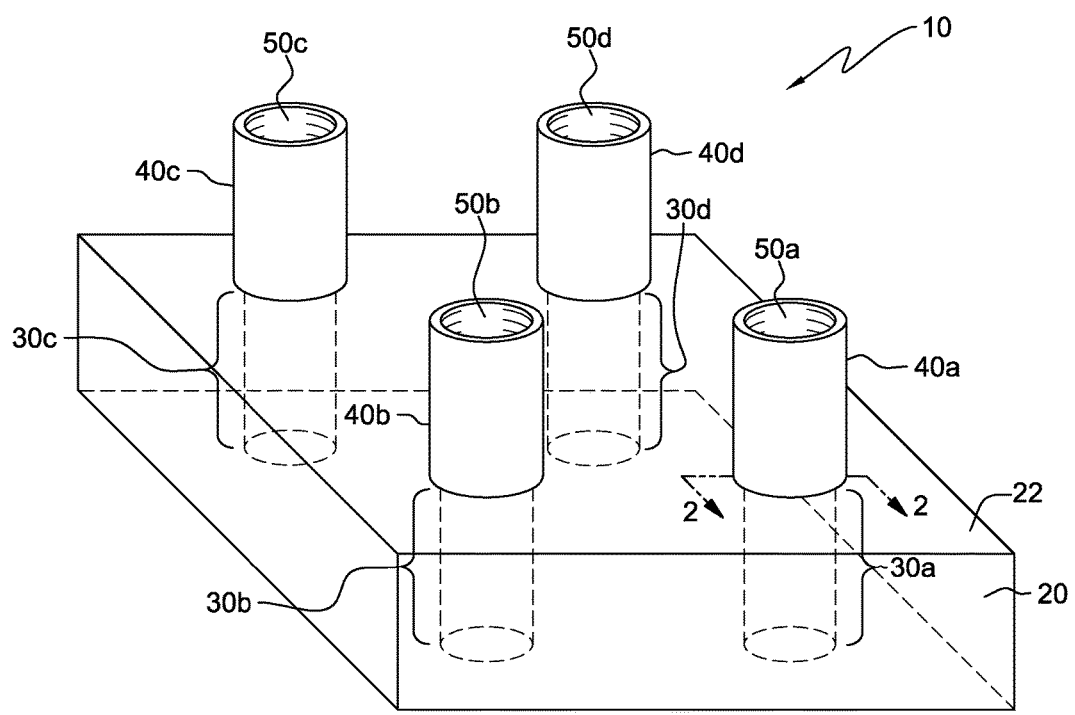
FIG. 1 is a perspective view of a probe supporting apparatus in accordance with one embodiment of the present invention.

FIG. 1 depicts a perspective view of probe supporting apparatus 10 for testing electrical characteristics of a device in accordance with one embodiment of the present invention. As shown, probe supporting apparatus 10 includes, nonconductive plate 20, through-holes 30a-d of nonconductive plate 20, probe positioning bodies 40a-d, and through-holes 50a-d of probe positioning bodies 40a-d respectively.

As shown, nonconductive plate 20 is a structure containing through-holes 30a-d extending from bottom surface 24 (shown in FIG. 2) of nonconductive plate 20 to top surface 22 of nonconductive plate 20. In one embodiment, nonconductive plate 20 may be substantially cuboid. In other embodiments, nonconductive plate 20 may be any geometry and may contain apertures (not shown). The apertures in nonconductive plate 20 may compensate for any bodies that protrude from the device to be tested, such that bottom surface 24 (shown in FIG. 2) of nonconductive plate 20 may be adjacent to the device to be tested in a desired manner.

In one embodiment, an adhesive, for releasably attaching bottom surface 24 (shown in FIG. 2) of nonconductive plate 20 to the device to be tested, is adhered to at least a portion of bottom surface 24 (shown in FIG. 2) of nonconductive plate 20. The adhesive may be, for example, commercially available glue or double-sided tape. The adhesive may allow bottom surface 24 (shown in FIG. 2) of nonconductive plate 20 to be detached from the device to be tested after testing is complete. In other embodiments, clips or other attaching means may be used to attach bottom surface 24 (shown in FIG. 2) of nonconductive plate 20 to the device to be tested.

Exemplary embodiments of nonconductive plate 20 may be fabricated from nonconductive material such as plastic or rubber. In other embodiments, nonconductive plate 20 may be fabricated from any material and be coated with a nonconductive coating. The nonconductive material or coating may reduce interference with the testing of the electrical characteristics of a device. In other embodiments, the nonconductive material may be at least partially transparent to ease alignment of probe supporting apparatus 10 on the device to be tested and to allow the underlying device to be seen during testing.

In one embodiment, through-holes 30a-d are positioned in nonconductive plate 20 such that, when bottom surface 24 (shown in FIG. 2) of nonconductive plate 20 is adjacent to a device to be tested, each through-hole at least partially overlays a testing site on the device to be tested. In other embodiments, nonconductive plate 20 may have one or more through-holes positioned in nonconductive plate 20 depending on the number of testing sites to be probed on the device to be tested. The positioning of through-holes 30a-d in nonconductive plate 20 will be discussed in further detail in reference to FIG. 5.

In one example, through-holes 30a-d are substantially cylindrical in shape to receive probes that are also substantially cylindrical in shape. In other embodiments, through-holes 30a-d may be frustoconical, cuboid, or any other shape that can receive a probe and allow the probe tip to contact a testing site. Through-holes 30a-d may all be the same shape or different shapes.

As shown, probe positioning bodies 40a-d protrude from top surface 22 of nonconductive plate 20 and contain through-holes 50a-d respectively. In one embodiment, probe positioning bodies 40a-d may be substantially cylindrical and have walls a thickness so as to facilitate probe support when probes are inserted in to through-holes 50a-d. In other embodiments, probe positioning bodies 40a-d may be any shape such as frustoconical or cuboid with walls a thickness so as to facilitate probe support when probes are inserted in to through-holes 50a-d.

Exemplary embodiments of probe positioning bodies 40a-d may comprise nonconductive material such as plastic or rubber. In other embodiments, probe positioning bodies may be fabricated from any material and be coated with a nonconductive coating. The nonconductive material or coating may reduce interference with the testing of the electrical characteristics of a device. In other embodiments, the nonconductive material may be transparent to ease alignment of probe supporting apparatus 10 when placed on the device to be tested and to allow the underlying device to be seen during testing. In one embodiment, nonconductive plate 20 and probe positioning bodies 40a-d may comprise the same material. In other embodiments, nonconductive plate 20 and probe positioning bodies 40a-d may comprise different material from each other so long as the material is at least nonconductive.

In one embodiment, probe positioning bodies 40a-d are positioned such that through-holes 50a-d at least partially align with through-holes 30a-d of nonconductive plate 20, respectively. In other embodiments, a probe positioning body, containing a through-hole, may be protruding from top surface 22 of nonconductive plate 20 for each through-hole in nonconductive plate 20 such that the through-hole in the probe positioning body at least partially aligns with a through-hole of nonconductive plate 20.

Through-holes 50a-d may be substantially cylindrical in shape to receive probes that are also substantially cylindrical in shape. In other embodiments, through-holes 50a-d may be frustoconical, cuboid, or any other shape that can receive a probe and allow the probe tip to contact a testing site. Through-holes 50a-d may be all be the same shape or different shapes. Alignment of through-holes 50a-d with through-holes 30a-d of nonconductive plate 20, respectively, will be discussed in further detail in reference to FIGS. 2-4.

Probe supporting apparatus 10 may be formed by a multitude of processes, such as injection molding or any other process capable of forming probe supporting apparatus 10. In one embodiment, probe supporting apparatus 10 may be formed as one piece, where nonconductive plate 20 and probe positioning bodies 40a-d are integral. In other embodiments, nonconductive plate 20 containing through-holes 30a-d and probe positioning bodies 40a-d containing through-holes 50a-d, respectively, may be formed separately then attached.

Figure 2:
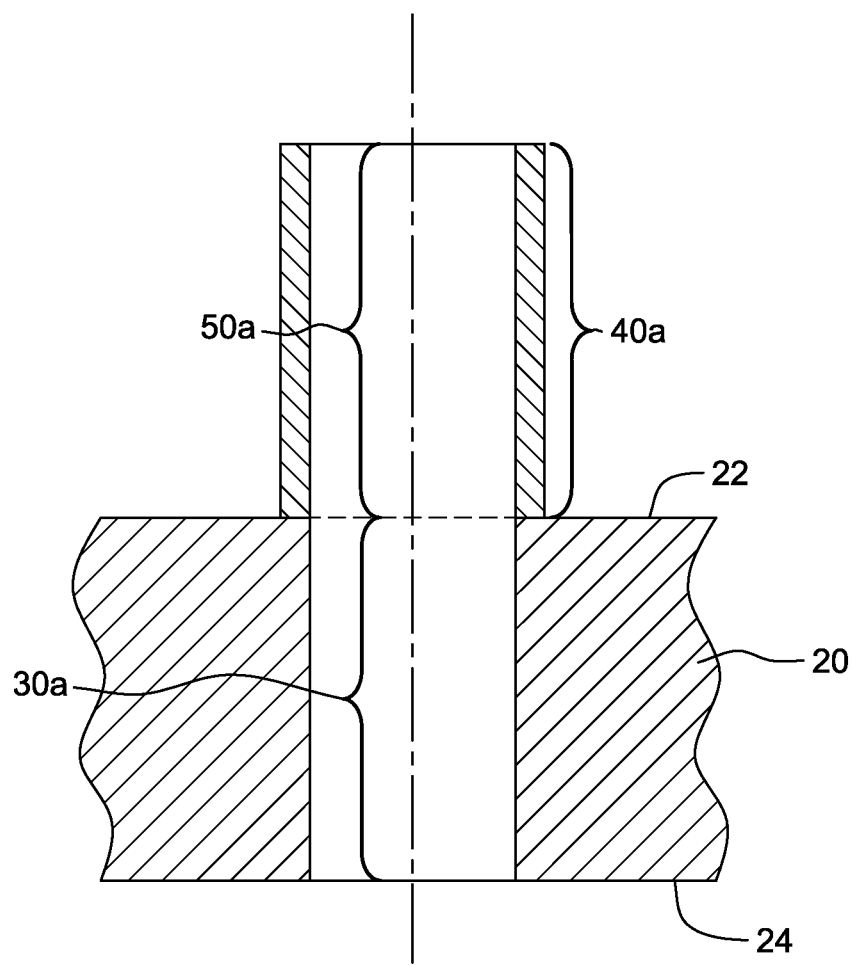
FIG. 2 is a sectional view of a probe supporting apparatus through line 2 of FIG. 1 illustrating an exemplary alignment of a through-hole of a probe supporting body with a through-hole of a nonconductive plate, in accordance with one embodiment of the present invention.
Figure 3:
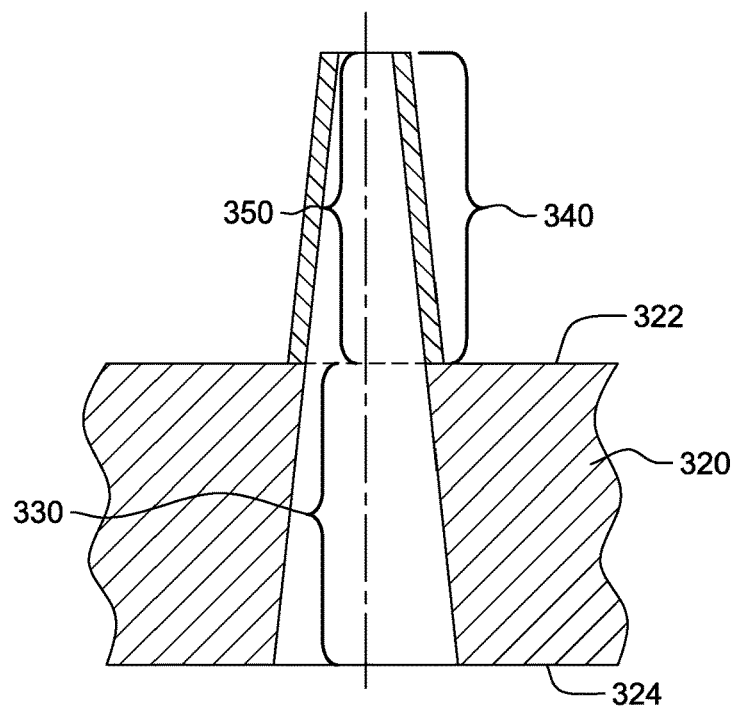
FIG. 3 is a sectional view of a probe supporting apparatus through line 2 of FIG. 1 illustrating an exemplary alignment of a through-hole of a probe supporting body with a through-hole of a nonconductive plate, in accordance with another embodiment of the present invention.
Figure 4:
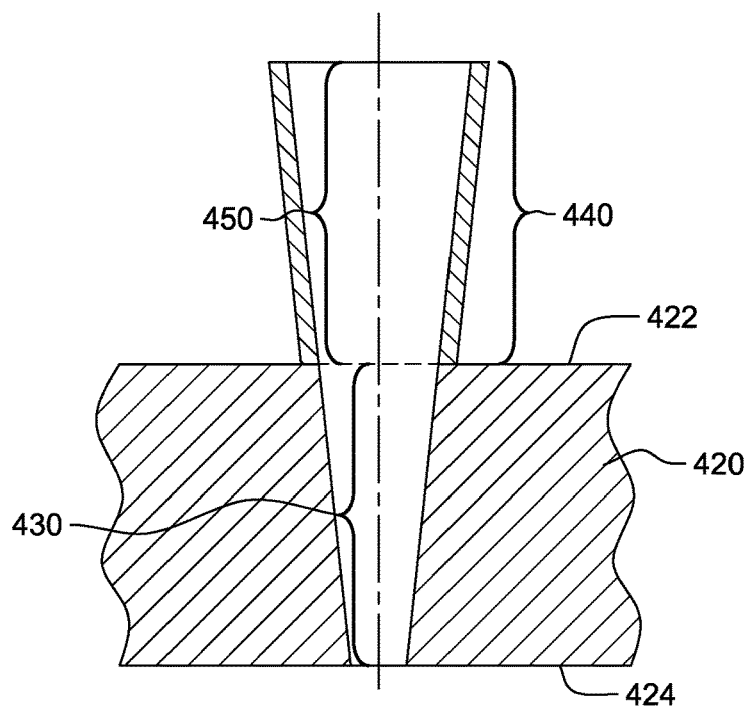
FIG. 4 is a sectional view of a probe supporting apparatus through line 2 of FIG. 1 illustrating an exemplary alignment of a through-hole of a probe supporting body with a through-hole of a nonconductive plate, in accordance with another embodiment of the present invention.

FIGS. 2 through 4 depict alternate sectional views of probe supporting apparatus 10 through line 2 of FIG. 1 illustrating exemplary alignments of a through-hole of a probe positioning body with a through-hole of a nonconductive plate, in accordance with multiple embodiments of the present invention.

FIG. 2 is a sectional view of probe supporting apparatus 10 through line 2 of FIG. 1 illustrating an exemplary alignment of through-hole 50a of probe positioning body 40a with through-hole 30a of nonconductive plate 20, in accordance with one embodiment of the present invention. Nonconductive plate 20 contains top surface 22, bottom surface 24, and through-hole 30a. Through-hole 30a is substantially cylindrical and extends from bottom surface 24 to top surface 22.

Probe positioning body 40a, containing through-hole 50a, is substantially cylindrical and protrudes from top surface 22 of nonconductive plate 20. Through-hole 50a is also substantially cylindrical and substantially concentrically arranged with probe positioning body 40a. Through-hole 30a and through-hole 50a have substantially equal diameters. Probe positioning body 40a is positioned such that through-hole 50a and through-hole 30a are aligned about a common central axis.

In one embodiment, through-hole 30a is of a sufficient diameter, where a bottom of through-hole 30a is essentially coplanar with bottom surface 24 of nonconductive plate 20, so as to allow a probe to pass through through-hole 30a and contact a testing site on a device to be tested. In another embodiment, through-hole 30a is of a sufficient diameter, where through-hole 30a is essentially coplanar with bottom surface 24 of nonconductive plate 20, so as to be completely overlying a testing site on a device to be tested.

FIG. 3 is a sectional view of probe supporting apparatus 10 through line 2 of FIG. 1 illustrating an exemplary alignment of through-hole 350 of probe positioning body 340 with through-hole 330 of nonconductive plate 320, in accordance with one embodiment of the present invention. Nonconductive plate 320 contains top surface 322, bottom surface 324, and through-hole 330. Through-hole 330 is substantially frustoconical and extends from bottom surface 324 to top surface 322. Through-hole 330 tapers from a larger diameter to a smaller diameter as it extends from bottom surface 324 to top surface 322 of nonconductive plate 320.

Probe positioning body 340, containing through-hole 350, is substantially frustoconical and protrudes from top surface 322 of nonconductive plate 320. Through-hole 350 is also substantially frustoconical and substantially concentrically arranged with probe positioning body 340. Through-hole 350 tapers from a larger diameter to a smaller diameter as it extends from top surface 322 of nonconductive plate 320.

Where through-hole 330 and through-hole 350 are essentially coplanar with top surface 322 of nonconductive plate 320, the diameter of through-hole 330 and the diameter of through-hole 350 at are substantially equal. Probe positioning body 340 is positioned such that through-hole 350 and through-hole 330 are aligned about a common central axis.

FIG. 4 is a sectional view of probe supporting apparatus 10 through line 2 of FIG. 1 illustrating an exemplary alignment of through-hole 450 of probe positioning body 440 with through-hole 430 of nonconductive plate 420, in accordance with one embodiment of the present invention. Nonconductive plate 420 contains top surface 422, bottom surface 424, and through-hole 430. Through-hole 430 is substantially frustoconical and extends from bottom surface 424 to top surface 422. Through-hole 430 tapers from a smaller diameter to a larger diameter as it extends from bottom surface 424 to top surface 422 of nonconductive plate 420.

Probe positioning body 440, containing through-hole 450, is substantially frustoconical and protrudes from top surface 422 of nonconductive plate 420. Through-hole 450 is also substantially frustoconical and substantially concentrically arranged with probe positioning body 440. Through-hole 450 tapers from a smaller diameter to a larger diameter as it extends from top surface 422 of nonconductive plate 420.

Where through-hole 430 and through-hole 450 are essentially coplanar with top surface 422 of nonconductive plate 420, the diameter of through-hole 430 and the diameter of through-hole 450 at are substantially equal. Probe positioning body 440 is positioned such that through-hole 450 and through-hole 430 are aligned about a common central axis.

Figure 5:
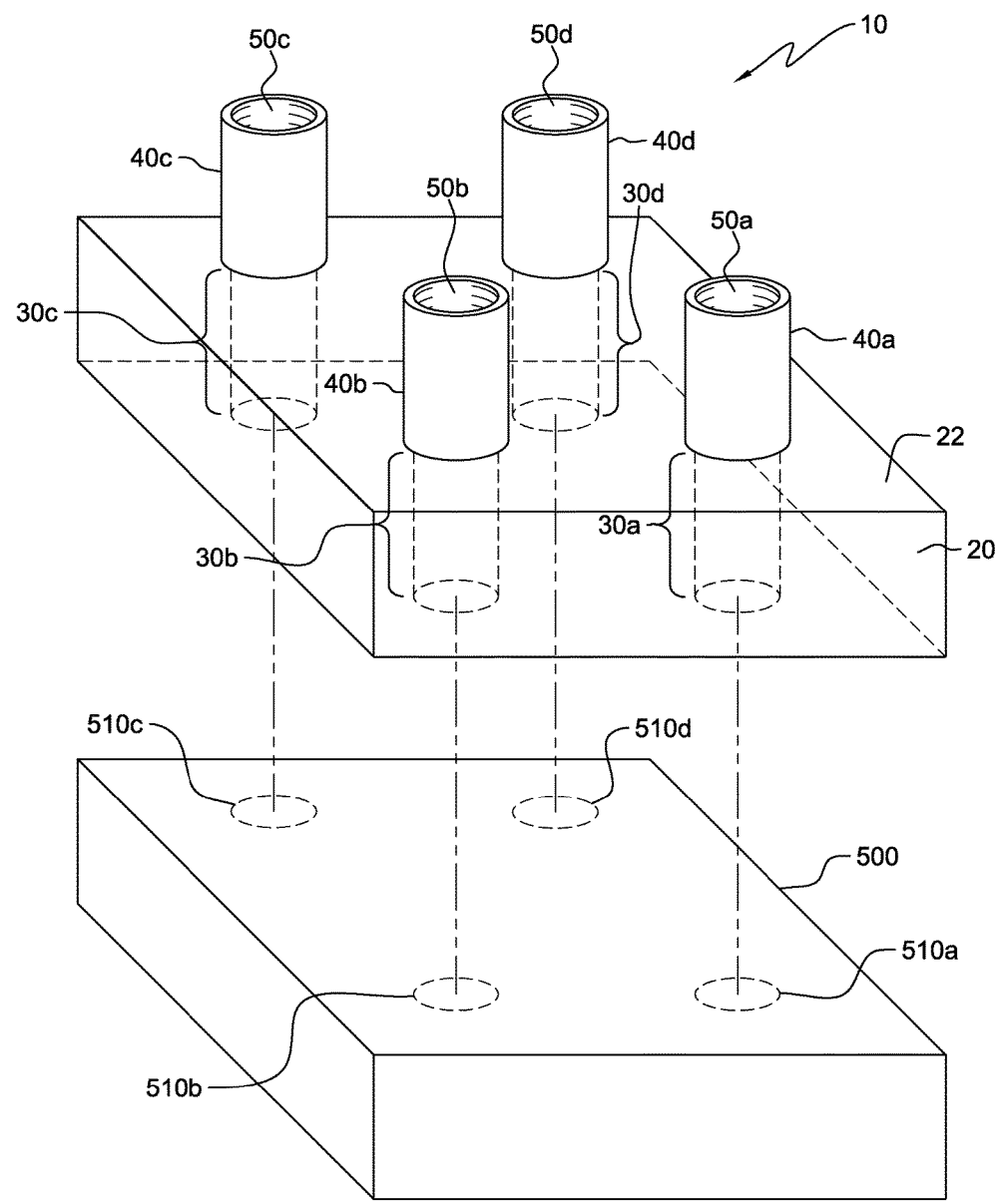
FIG. 5 is an exploded view of a probe supporting apparatus and a corresponding device to be tested in a nonattached state illustrating the positioning of one or more through-holes in a nonconductive plate.

FIG. 5 is an exploded view of probe supporting apparatus 10 and a corresponding device to be tested 500 in a nonattached state, illustrating the positioning of through-holes 30a-d in nonconductive plate 20. Probe supporting apparatus 10 includes, nonconductive plate 20, through-holes 30a-d of nonconductive plate 20, probe positioning bodies 40a-d, and through-holes 50a-d of probe positioning bodies 40a-d respectively, as discussed in reference to FIG. 1 and FIG. 2.

In one embodiment, device to be tested 500 is a device containing testing sites 510ad. Device to be tested 500 may be a printed circuit board (PCB), a ball grid array (BGA) device, such as a microprocessor, or any type of electronic device with one or more testing sites. Testing sites may include, for example, vias, signal pads, ground contacts, or BGA contacts.

In one embodiment, through-holes 30a-d are positioned in nonconductive plate 20 such that, when bottom surface 24 of nonconductive plate 20 is adjacent to device to be tested 500, through-holes 30a-d at least partially overlay testing sites 510a-d on device to be tested 500, respectively. In other embodiments, through-holes 30a-d are positioned in nonconductive plate 20 such that, when bottom surface 24 of nonconductive plate 20 is adjacent to device to be tested 500, through-holes 30a-d completely overlay testing sites 510a-d on device to be tested 500, respectively.

The terminology used herein is for the purpose of describing particular embodiments only and is not intended to be limiting of the present invention. As used herein, the singular forms "a", "an" and "the" are intended to include the plural forms as well, unless the context clearly indicates otherwise.

Having described embodiments of a probe supporting apparatus (which are intended to be illustrative and not limiting), it is noted that modifications and variations may be made by persons skilled in the art in light of the above teachings. It is therefore to be understood that changes may be made in the particular embodiments disclosed which are within the scope of the present invention as outlined by the appended claims.

What is claimed is:

1. A probe supporting apparatus for testing electrical characteristics of a device, the device having one or more testing sites, comprising:
   a nonconductive plate having a top surface, a bottom surface, and a through-hole, wherein the through-hole is positioned such that the through-hole at least partially overlays one of the one or more testing sites when at least a portion of the bottom surface of the nonconductive plate is adjacent to the device to be tested; and
   a probe positioning body protruding from the top surface of the nonconductive plate and having a through-hole, wherein the probe positioning body is positioned such that the through-hole of the probe positioning body at least partially aligns with the through-hole of the nonconductive plate for allowing insertion of a probe through both of the through-hole of the probe positioning body and the through-hole of the nonconductive plate;
   wherein the probe positioning body includes a substantially cylindrical wall of substantially uniform thickness protruding from the top surface of the nonconductive plate for supporting the probe inserted through both of the through-hole of the probe positioning body and the through-hole of the nonconductive plate;
   wherein the bottom surface of the nonconductive plate includes at least one aperture that compensates for a protruding body of the device to be tested.

2. The probe supporting apparatus of claim 1, wherein the through-hole of the nonconductive plate is substantially cylindrical and wherein the through-hole of the probe positioning body is substantially cylindrical.

3. The probe supporting apparatus of claim 2, wherein the probe positioning body is positioned such that the through-hole of the probe positioning body at least partially aligns with the through-hole of the nonconductive plate, and the through-hole of the probe positioning body and the through-hole of the nonconductive plate are substantially axially aligned about a central axis.

4. The probe supporting apparatus of claim 3, wherein the probe positioning body is positioned such that the through-hole of the probe positioning body at least partially aligns with the through-hole of the nonconductive plate, and the through-hole of the probe positioning body and the through-hole of the nonconductive plate are substantially axially aligned about a central axis, and the through-hole of the probe positioning body and the through-hole of the nonconductive plate have substantially equal diameters.

5. The probe supporting apparatus of claim 1, wherein the nonconductive plate comprises a transparent material.

6. The probe supporting apparatus of claim 1, further comprising clips for attaching the bottom surface of the nonconductive plate to the device to be tested.

7. The probe supporting apparatus of claim 1, wherein the nonconductive plate and the probe positioning body protruding from the top surface of the nonconductive plate comprise the same material.

8. The probe supporting apparatus of claim 7, wherein the probe supporting apparatus is formed as one piece, such that the nonconductive plate and the probe positioning body protruding from the top surface of the nonconductive plate are integral.

9. The probe supporting apparatus of claim 1, wherein the through-hole of the probe positioning body and the through-hole of the nonconductive plate have substantially equal diameters.

10. The probe supporting apparatus of claim 1, wherein the through-hole of the nonconductive plate is substantially cuboid.

11. The probe supporting apparatus of claim 1, further comprising clips for attaching the bottom surface of the nonconductive plate to the device to be tested,
wherein the nonconductive plate and the probe positioning body protruding from the top surface of the nonconductive plate comprise the same material,
wherein the probe supporting apparatus is formed as one piece, such that the nonconductive plate and the probe positioning body protruding from the top surface of the nonconductive plate are integral,
wherein the through-hole of the nonconductive plate is substantially cuboid, and wherein the through-hole of the probe positioning body is substantially cuboid.

12. A probe supporting apparatus for testing electrical characteristics of a device, the device having one or more testing sites, the probe supporting apparatus comprising:
a nonconductive plate having a top surface, a bottom surface, and a through-hole extending between the top and bottom surfaces; and
a probe positioning body protruding from the nonconductive plate and having a through-hole, wherein the through-hole of the probe positioning body and the through-hole of the nonconductive plate are axially aligned about a central axis,
wherein the through-hole of the probe positioning body and the through-hole of the nonconductive plate have substantially equal inner diameters measured perpendicular to the central axis.

13. The probe supporting apparatus of claim 12, wherein the through-hole of the nonconductive plate is substantially cylindrical and wherein the through-hole of the probe positioning body is substantially cylindrical.

14. The probe supporting apparatus of claim 12, wherein the probe positioning body protrudes from the top surface of the nonconductive plate, wherein the probe positioning body is a separate piece from the nonconductive plate, wherein an end of the through-hole of the probe positioning body and an end of the through-hole of the nonconductive plate are substantially coplanar with the top surface of the nonconductive plate.

15. The probe supporting apparatus of claim 12, wherein the nonconductive plate comprises a transparent material.

16. The probe supporting apparatus of claim 12, further comprising clips for attaching the bottom surface of the nonconductive plate to the device to be tested.

17. The probe supporting apparatus of claim 12, wherein the nonconductive plate and the probe positioning body protruding from the nonconductive plate comprise the same material.

18. The probe supporting apparatus of claim 17, wherein the probe supporting apparatus is formed as one piece, such that the nonconductive plate and the probe positioning body protruding from the top surface of the nonconductive plate are integral.

19. The probe supporting apparatus of claim 12, wherein the inner diameter of the through-hole of the probe positioning body is defined by a straight line that extends from a point on an innermost cylindrical wall of the probe positioning body, through the central axis to a different point on the innermost cylindrical wall of the probe positioning body, the innermost cylindrical wall defining the through-hole.

20. The probe supporting apparatus of claim 12, wherein the inner diameter of the nonconductive plate is defined by a straight line that extends from a point on an innermost cylindrical wall of the nonconductive plate, through the central axis to a different point on the innermost cylindrical wall of the nonconductive plate, the innermost cylindrical wall defining the through-hole.

* * * * *